(12) United States Patent
Park (10) Patent No.: US 8,315,064 B2
(45) Date of Patent: Nov. 20, 2012

(54) APPARATUS FOR DETECTING PATTERN ALIGNMENT ERROR

(75) Inventor: Jeong Hyun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/098,764

(22) Filed: May 2, 2011

(65) Prior Publication Data

US 2011/0203935 A1   Aug. 25, 2011

Related U.S. Application Data

(62) Division of application No. 11/868,561, filed on Oct. 8, 2007, now abandoned.

(30) Foreign Application Priority Data

Sep. 10, 2007  (KR) .................. 10-2007-0091798

(51) Int. Cl.
*H05K 7/00* (2006.01)

(52) U.S. Cl. ........ 361/777; 361/760; 361/767; 361/818; 174/260; 174/261; 174/262; 174/266; 29/846; 29/847; 438/106; 438/128; 257/432; 257/676; 257/737; 257/773

(58) Field of Classification Search .................. 361/777, 361/760, 767, 818; 174/260, 261, 262, 266; 29/846, 847; 438/106, 128; 257/432, 676, 257/737, 773

See application file for complete search history.

(56) References Cited

U.S. PATENT DOCUMENTS

| | | | |
|---|---|---|---|
| 5,055,550 A | 10/1991 | Mueller et al. | |
| 5,434,452 A | 7/1995 | Higgins, III | |
| 5,780,926 A | 7/1998 | Seo | |
| 5,993,185 A | 11/1999 | Furr | |
| 6,141,182 A | 10/2000 | Amemiya et al. | |
| 6,229,673 B1 | 5/2001 | Shinohara et al. | |
| 6,281,581 B1 | 8/2001 | Desai et al. | |
| 6,485,843 B1 | 11/2002 | Eslamy | |
| 6,828,513 B2 | 12/2004 | Kistner | |
| 7,045,719 B1 | 5/2006 | Alexander et al. | |
| 7,337,530 B1 | 3/2008 | Stoev et al. | |
| 7,402,757 B1 | 7/2008 | Noujeim | |
| 7,503,111 B2 | 3/2009 | Haridass et al. | |

(Continued)

FOREIGN PATENT DOCUMENTS

JP   2000-068191 A   3/2000

(Continued)

OTHER PUBLICATIONS

USPTO OA mailed Oct. 13, 2010 in connection with U.S. Appl. No. 11/868,561.

(Continued)

*Primary Examiner* — Xiaoliang Chen
(74) *Attorney, Agent, or Firm* — Ladas & Parry LLP (57) ABSTRACT

An apparatus for detecting pattern alignment error includes a first conductive pattern disposed over a first insulation member with a power source applied of the first conductive pattern; a second insulation member for covering the first conductive pattern; a second conductive pattern disposed on the second insulation member; a conductive via connected to the second conductive pattern and passing through the second insulation member; and an insulation pattern disposed in the first conductive pattern for detecting an alignment error in response to a position of the conductive via. The apparatus for detecting pattern alignment error can detect the alignment of lower wiring in a device with multi-layer wiring.

3 Claims, 9 Drawing Sheets

U.S. PATENT DOCUMENTS

| | | |
|---|---|---|
| 7,776,199 B2 | 8/2010 | Fujinami et al. |
| 2002/0052065 A1 | 5/2002 | Ogura |
| 2002/0119594 A1 | 8/2002 | Van Veen et al. |
| 2003/0201123 A1 | 10/2003 | Kistner |
| 2004/0124957 A1 | 7/2004 | Eliacin et al. |
| 2005/0067722 A1 | 3/2005 | Koike |
| 2006/0131700 A1 | 6/2006 | David et al. |
| 2007/0103632 A1 | 5/2007 | Chen et al. |
| 2007/0158104 A1 | 7/2007 | Fujinami et al. |
| 2007/0278416 A1 | 12/2007 | Kawai |
| 2008/0049410 A1 | 2/2008 | Kawaguchi et al. |
| 2008/0087459 A1 | 4/2008 | Das et al. |
| 2008/0151513 A1 | 6/2008 | Parchesky |
| 2008/0170819 A1 | 7/2008 | Kodama et al. |
| 2008/0237893 A1 | 10/2008 | Quach et al. |
| 2008/0239683 A1 | 10/2008 | Brodsky et al. |
| 2008/0250377 A1 | 10/2008 | Bird et al. |
| 2010/0219495 A1 | 9/2010 | Liu |

FOREIGN PATENT DOCUMENTS

| | | |
|---|---|---|
| KR | 1020070070069 A | 7/2007 |

OTHER PUBLICATIONS

USPTO FOA mailed Feb. 2, 2011 in connection with U.S. Appl. No. 11/868,561.

APPARATUS FOR DETECTING PATTERN ALIGNMENT ERROR

CROSS-REFERENCE TO RELATED APPLICATIONS

The present application claims priority to Korean patent application number 10-2007-91798 filed on Sep. 10, 2007, which is incorporated herein by reference in its entirety.

BACKGROUND OF THE INVENTION

The present invention relates to an apparatus for detecting a pattern alignment error.

Recent, developments in semiconductor device fabrication have led to a technology for fabricating a semiconductor package with a semiconductor device and a circuit board on which the semiconductor package is mounted.

In the development, the semiconductor device, semiconductor package and circuit board may have a multi-layered wiring structure.

For example, a circuit board may include wirings disposed on different layers in order to input or output various types of signals.

In this technology, in order to form the wirings in different layers, a lower wiring is formed on a lower insulation member, and the lower wiring is insulated by an upper insulation member. Subsequently, an upper wiring is formed on the upper insulation member, and the upper wiring is then electrically connected to the lower wiring through a conductive via.

However, when the wirings are disposed on different layers, they are often not aligned accurately, and the upper wiring and lower wiring end up not being connected to each other through the conductive via.

An alignment error of the upper wiring can be easily recognized through a visual test while, but an alignment error of the lower wiring is hard to recognized through a visual test because the lower wiring has been covered by the upper insulation member.

BRIEF SUMMARY OF THE INVENTION

Embodiments of the present invention are directed to an apparatus for detecting pattern alignment error, and more specifically to an apparatus that is adapted to detect the alignment of the lower wiring of a device with multi-layered wiring.

In one embodiment, an apparatus for detecting pattern alignment error may comprise a first conductive pattern disposed over a first insulation member with a power source applied to the first conductive pattern; a second insulation member covering the first conductive pattern; a second conductive pattern disposed on the second insulation layer; a conductive via connected to the second conductive pattern and passing through the second insulation member; and an insulation pattern disposed in the first conductive pattern for detecting an alignment error in response to a position of the conductive via.

The insulation pattern may be a through hole passing through the first conductive pattern. Alternatively, the insulation pattern may be disposed over the first conductive pattern.

The power source is a DC voltage. An area of the insulation pattern is about 105 to 200% of the area of the conductive via. The insulation pattern may have a circular shape when viewed from above with a diameter of 50 µm to 200 µm.

The apparatus for detecting pattern alignment error may further comprise a third conductive pattern disposed over the second insulation member and an additional conductive via passing through the second insulation member that connects the third conductive pattern to the first conductive pattern; and a power line that is electrically connected to the third conductive pattern rather than the first conductive pattern and a power source applied to the power line.

A plated layer may be formed on the second and third conductive patterns in a case where the conductive via is disposed over the first conductive pattern.

The plated layer will be formed only on the third conductive pattern in a case where the conductive via is disposed over the insulation pattern rather than the first conductive pattern.

The apparatus for detecting a pattern alignment error may include a number of second conductive patterns and insulation patterns corresponding to each second conductive pattern, and the insulation patterns may all be different sizes.

DESCRIPTION OF SPECIFIC EMBODIMENTS

Hereafter, an apparatus for detecting a pattern alignment error in accordance with embodiments of the present invention will be described with reference to the attached drawings.

The apparatus for detecting a pattern alignment error to be described herein after is disposed at a periphery of an active area on which a multi-layered wiring is formed. Also, a first conductive pattern of the apparatus for detecting a pattern alignment error is formed simultaneously with the lower wiring disposed at the active area. A second pattern is formed simultaneously with the upper wiring disposed at the active area.

Figure 1:
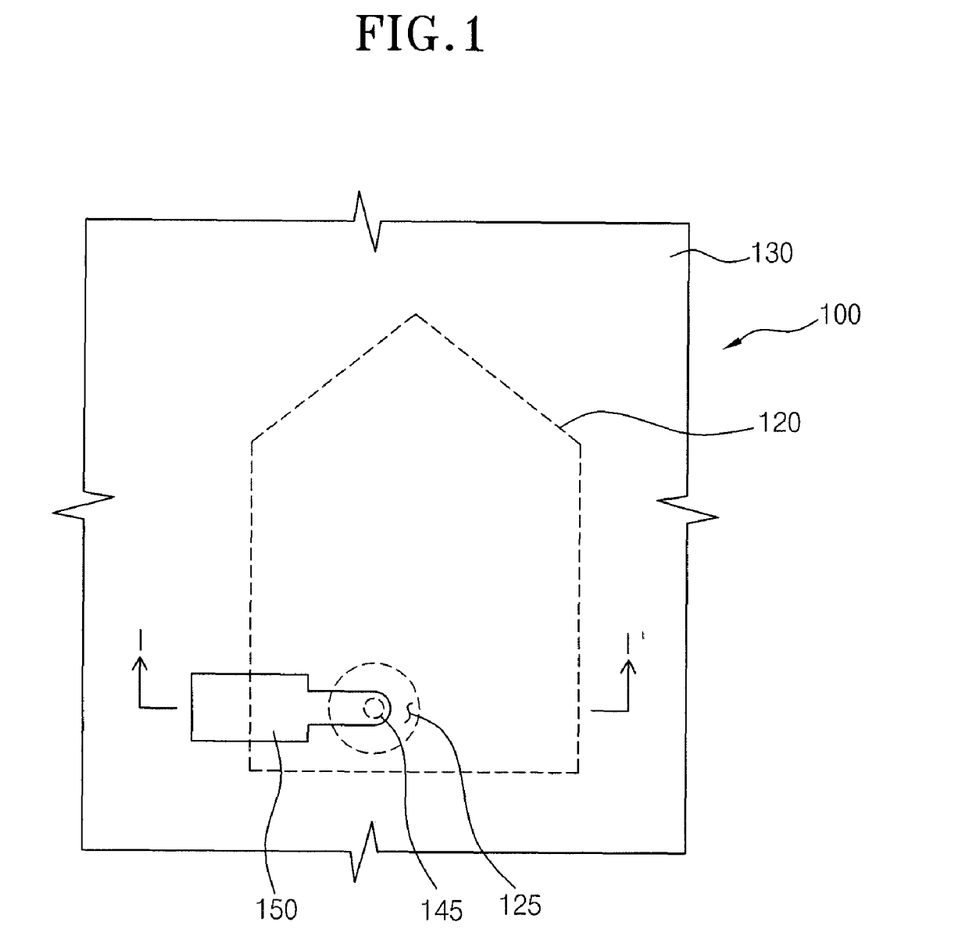
FIG. 1 is a plan view illustrating an apparatus for detecting pattern alignment error in accordance with a first embodiment of the present invention.
Figure 2:
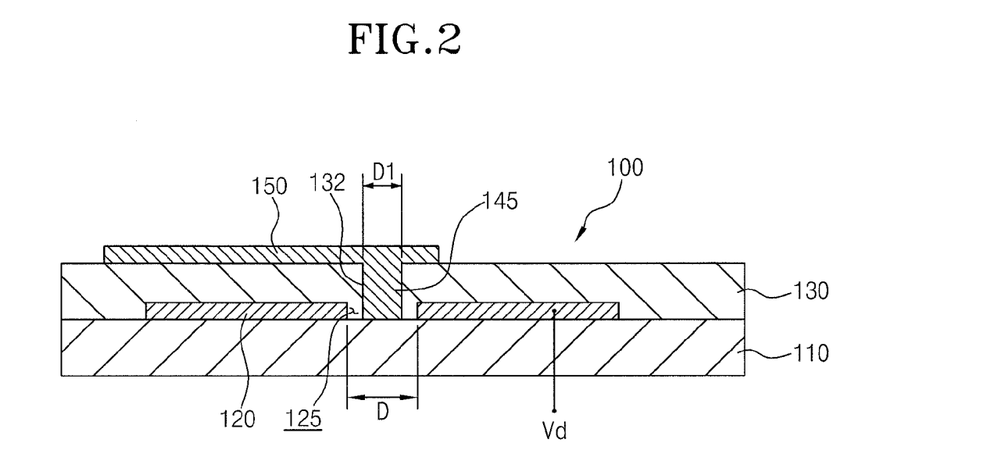
FIG. 2 is a cross-sectional view taken along line I-I' in FIG. 1.
Figure 3:
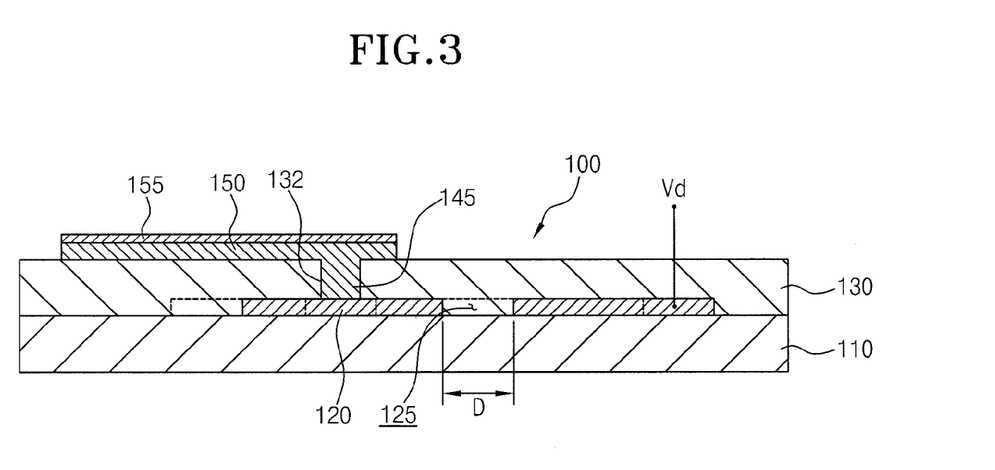
FIG. 3 is a cross-sectional view illustrating that a first conductive pattern shown in FIG. 2 is disposed out of the alignment error range.

FIG. 1 is a plan view illustrating an apparatus for detecting pattern alignment error in accordance with a first embodiment of the present invention. FIG. 2 is a cross-sectional view taken along line I-I' in FIG. 1 showing a case where the first conductive layer is formed within the alignment error range. FIG. 3 shows a case where the first conductive layer is formed outside of the alignment error range.

Referring to FIGS. 1, 2, and 3, the pattern alignment error detecting apparatus 100 includes a first insulation member 110, a first conductive pattern 120 having an insulation pattern 125, a second insulation member 130, and a second conductive pattern 150 having a conductive via 145.

The first conductive pattern 120 is disposed over the first insulation member 110 which includes insulation material. The first conductive pattern 120 may be electrically connected, for example, to a power line (not shown) through which a DC power source Vd is applied.

In the present embodiment, an example of material which may be used as the first conductive pattern 120 and the power line include aluminum, aluminum alloy, copper, cooper alloy, metal alloy, etc.

The first conductive pattern 120 includes the insulation pattern 125. The insulation pattern 125 may be disposed, for example, in the center part of the first conductive pattern 120. In the present embodiment, the insulation pattern 125 may be a through hole that is formed in a portion of the first conductive pattern 120. The insulation pattern 125 has a circular shape when viewed from above with a diameter D. For example, the diameter D of the insulation pattern 125 may be about 50 µm to about 200 µm. The diameter D of the insulation pattern 125 may otherwise vary within the alignment error range.

The second insulation member 130 is disposed over the first insulation member 110 and consequently covers the first conductive pattern 120. The second insulation member 130 includes insulation material.

A via hole 132 passes through the second insulation member 130. In the present embodiment, when the first conductive pattern 120 is formed within the alignment error range, the via hole 132 is located at the portion corresponding to the insulation pattern 125 of the first conductive pattern 120 (as shown in FIG. 2). When the first conductive pattern 120 is formed outside of the alignment error range, the via hole 132 will be located at a portion of the first conductive pattern 120 adjacent to the insulation pattern 125 (as shown in FIG. 3).

A conductive via 145 is placed inside the via hole 132 formed in the second insulation member 130. In the present embodiment, the conductive via 145 may have a cylindrical shape. The conductive via 145 having a cylindrical shape has a diameter D1 that is smaller than the diameter D of the insulation pattern 125. In the present embodiment, the area of the insulation pattern 125 may be about 105 to 200% of the area of the conductive via 145.

The second conductive pattern 150 is disposed over the second insulation member 130. In the present embodiment, the conductive via 145 and the second conductive pattern 150 may be formed integrally.

An examples of material that may be used as the conductive via 145 and the second conductive pattern 150 include aluminum, aluminum alloy, copper, cooper alloy, and metal alloy, etc.

Hereinafter, the operation of the pattern alignment error detecting apparatus in accordance with the first embodiments of the present invention will be described with reference to the attached drawings.

FIG. 2 shows the case where the first conductive pattern 120 is disposed within the alignment error range. A plating solution may be applied to the second conductive pattern 150. The conductive via 145 and the first conductive pattern 120 are spaced apart from each other (i.e. they don't connect) and thus the DC voltage Vd applied to the first conductive pattern 120 does not reach the second conductive pattern 150 through the conductive via 145.

Therefore, when the first conductive pattern 120 is disposed within the alignment error range, the second conductive pattern 150 does not receive DC voltage Vd, and consequently a plated layer is not formed over the second conductive pattern 150 even when the second conductive pattern 150 comes into contact with a plating solution. When the plating area is not formed, the fact that the first conductive pattern 120 is disposed within the alignment error range is confirmed. Alternatively, it is possible to confirm that the first conductive pattern 120 is disposed within the alignment error range, by measuring the voltage of the second conductive pattern 150 rather than applying a plating solution.

FIG. 3 is a cross-sectional view illustrating that the first conductive pattern shown in FIG. 2 is disposed out of the alignment error range.

FIG. 3 shows a case where the first conductive pattern 120 is disposed out of the alignment error range. In FIG. 3, the conductive via 145 is electrically connected to the first conductive pattern 120. Therefore, the DC voltage Vd applied to the first conductive pattern 120 is reaches the second conductive pattern 150 through the conductive via 145.

Therefore, when the plating solution is applied to the second conductive pattern 150 and the first conductive pattern 120 is out of the alignment error range, the second conductive pattern 150 receives DC voltage Vd and a plated layer 155 is formed over the second conductive pattern 150. Alternatively, it is possible to confirm easily that the disposition of the first conductive pattern 120 is out of the alignment error range by measuring the voltage of the second conductive pattern 150 rather than applying the plating solution.

Figure 4:
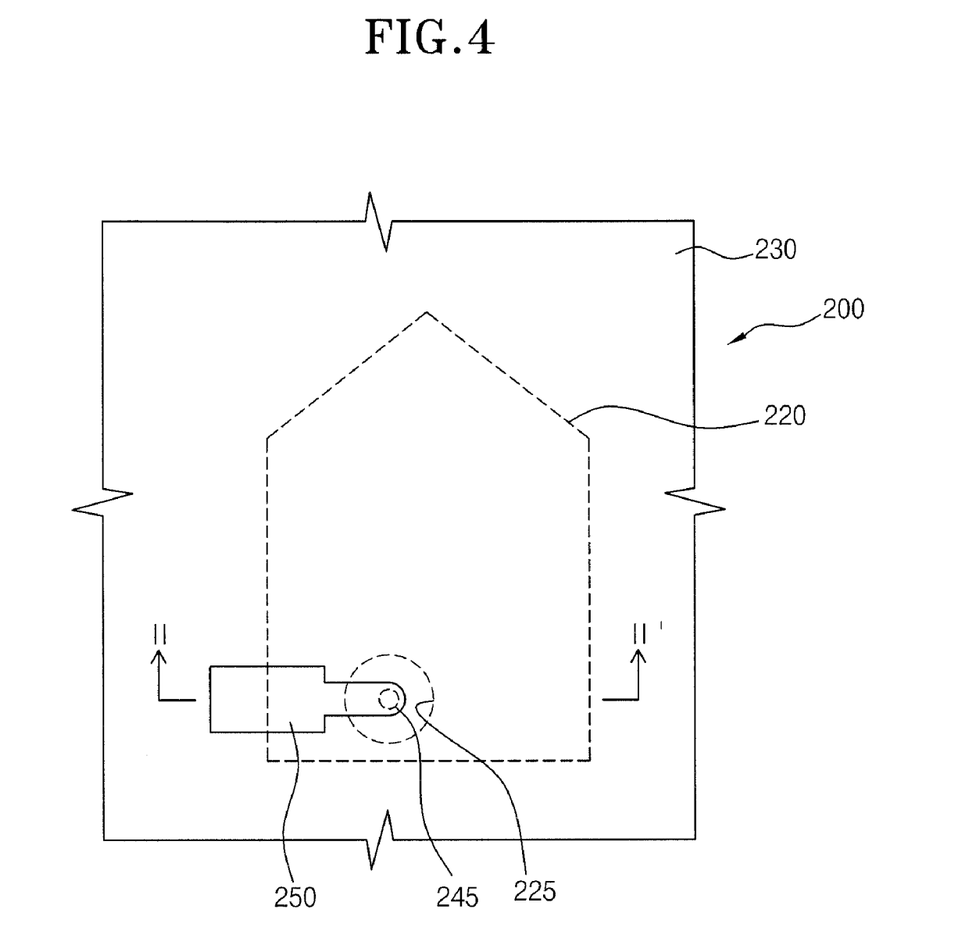
FIG. 4 is a plan view illustrating an apparatus for detecting pattern alignment error in accordance with a second embodiment of the present invention.
Figure 5:
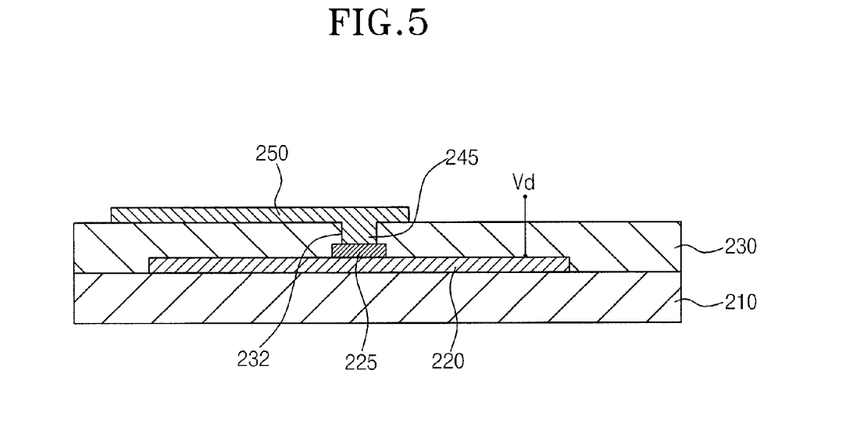
FIG. 5 is a cross-sectional view taken along line II-II' in FIG. 4.
Figure 6:
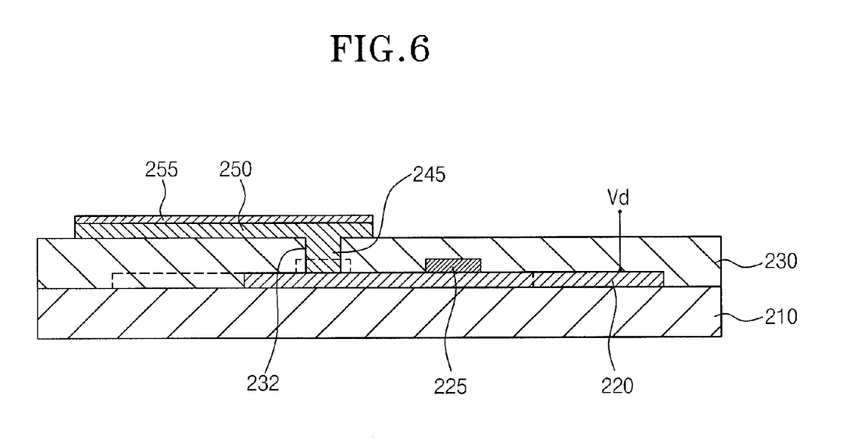
FIG. 6 is a cross-sectional view illustrating that a first conductive pattern shown in FIG. 5 is disposed out of the alignment error range.

FIG. 4 is a plan view illustrating an apparatus for detecting pattern alignment error in accordance with a second embodiment of the present invention. FIG. 5 is a cross-sectional view taken along line II-II' in FIG. 4 showing a case where the first conductive layer is formed within the alignment error range. FIG. 6 shows a case where the first conductive layer is formed outside of the alignment error range.

Referring to FIGS. 4, 5, and 6, the pattern alignment error detecting apparatus 200 includes a first insulation member 210, a first conductive pattern 220 having an insulation pattern 225, a second insulation member 230, and a second conductive pattern 250 having a conductive via 245.

The first conductive pattern 220 is disposed over the first insulation member 210. The insulation member includes an insulation material. The first conductive pattern 220 is electrically connected, for example, to a power line (not shown) through which a DC power source Vd is applied.

In the present embodiment, examples of material that may be used as the first conductive pattern 220 and the power line include aluminum, aluminum alloy, copper, cooper alloy, metal alloy, etc.

The first conductive pattern 220 includes the insulation pattern 225. The insulation pattern 225 may be disposed, for example, on the center part of the first conductive pattern 220.

In the present embodiment, the insulation pattern 225 may be disposed over the first conductive pattern 220. The insulation pattern 225 may be an insulation layer disposed over the first conductive pattern 220, or alternatively, the insulation pattern 225 may be a photoresist pattern disposed over the first conductive pattern 220.

The insulation pattern 225 disposed over the first conductive pattern 220 has a disc shape with a diameter D when viewed from above. The diameter D of the insulation pattern 225 may be about 50 µm to about 200 µm. The diameter D of the insulation pattern 225 may otherwise vary within an alignment error range.

The second insulation member 230 is disposed over the first insulation member 210 and consequently covers the first conductive pattern 220. The second insulation member 230 includes insulation material.

A via hole 232 is located in the second insulation member 230. The via hole 232 passes through the second insulation member 230. In the present embodiment, when the first conductive pattern is formed within the alignment error range (as shown in FIG. 5), the via hole 232 is formed in the area of the second insulation layer that corresponds to the insulation pattern 225 disposed over the first conductive pattern 220. When the first conductive pattern is formed outside of the alignment error range (as shown in FIG. 6), the via hole 232 is formed on a portion of the first conductive pattern 220 adjacent to the insulation pattern 225.

A conductive via 245 is placed inside the via hole 232 formed in the second insulation member 230. In the present embodiment, the conductive via 245 may have a cylindrical shape. The conductive via 245 having a cylindrical shape has a diameter D1 that is smaller than the diameter D of the insulation pattern 225 disposed over the first conductive pattern 220. In the present embodiment, the area of the insulation pattern 225 may be about 105 to 200% of the area of the conductive via 245.

The second conductive pattern 250 is disposed over the second insulation member 230. In the present embodiment, the conductive via 245 and the second conductive pattern 250 may be formed integrally.

Examples of material that may be used as the conductive via 245 and the second conductive pattern 250 include aluminum, aluminum alloy, copper, cooper alloy, metal alloy, etc.

Hereinafter, the operation of the pattern alignment error to detecting apparatus in accordance with the second embodiments of the present invention will be described with reference to the attached drawings.

FIG. 5 shows the case where the first conductive pattern 220 is disposed within the alignment error range. In the pattern alignment error device, a plating solution may be applied to the second conductive pattern. When the first conductive pattern 220 is disposed within the alignment error range, the conductive via 245 is disposed over the insulation pattern 225 of the first conductive pattern 220, and thus the DC voltage Vd applied to the first conductive pattern 220 does not reach the second conductive pattern 250 through the conductive via 245 due to the insulation pattern 225.

Therefore, when the first conductive pattern 220 is disposed within an alignment error range, the second conductive pattern 250 idoes not receive the DC voltage Vd and consequently a plated layer does not form over the second conductive pattern 250 even when the second conductive pattern 250 comes into contact with a plating solution. When the plating area is not formed, the fact that the first conductive pattern 120 is disposed within the alignment error range is confirmed. Alternatively, it is possible to confirm that the first conductive pattern 220 is disposed within the alignment error range by measuring the voltage of the second conductive pattern 250 rather than applying a plating solution.

FIG. 6 is a cross-sectional view illustrating that the first to conductive pattern shown in FIG. 5 is disposed out of the alignment error range.

FIG. 6 shows a case where the first conductive pattern 220 is disposed out of the alignment error range. The conductive via 245 is electrically connected to the first conductive pattern 220. Therefore, the DC voltage Vd applied to the first conductive pattern reaches the second conductive pattern 250 through the conductive via 245.

Therefore, when the plating solution is applied to the second conductive pattern and the the first conductive pattern 220 is out of the alignment error range, the second conductive pattern 250 receives DC voltage Vd and thus a plated layer 255 is formed over the second conductive pattern 250. Alternatively, it is possible to confirm easily that the disposition of the first conductive pattern 220 is out of the alignment error range by measuring the voltage of the second conductive pattern 250 rather than applying the plating solution.

Figure 7:
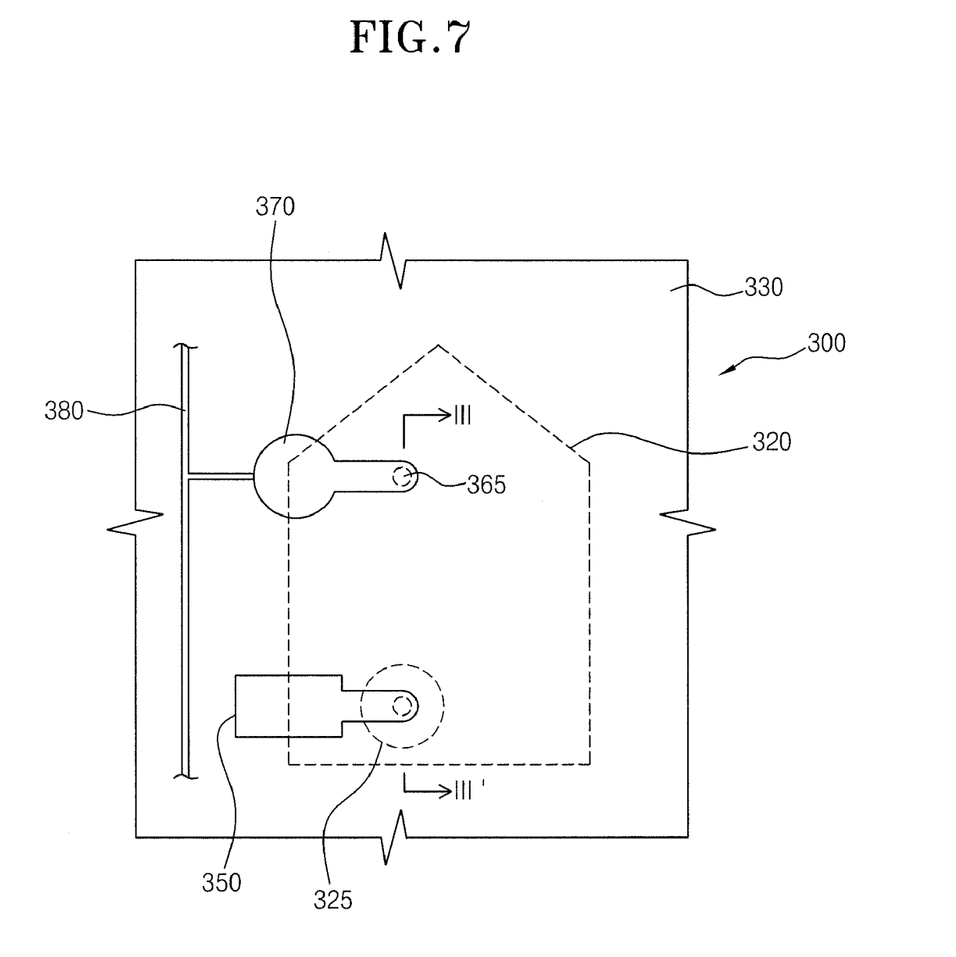
FIG. 7 is a plan view illustrating an apparatus for detecting pattern alignment error in accordance with a third embodiment of the present invention.
Figure 8:
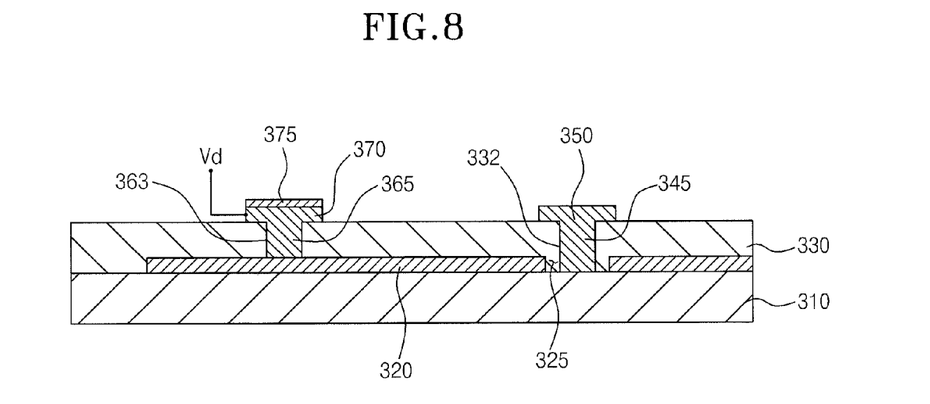
FIG. 8 is a cross-sectional view taken along line III-III' in FIG. 7.
Figure 9:
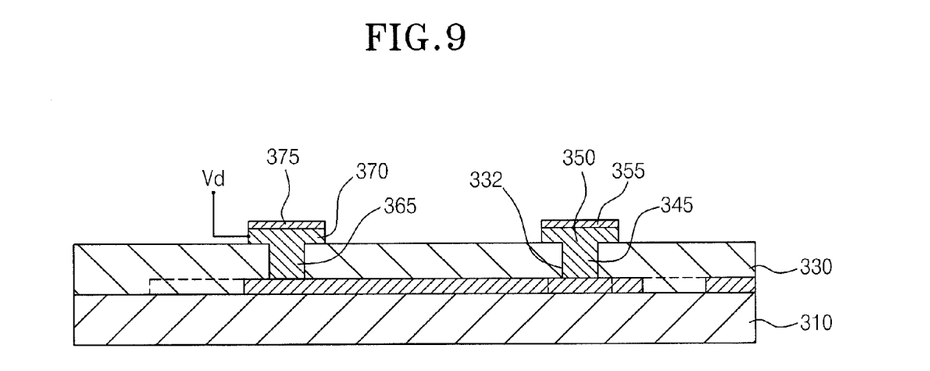
FIG. 9 is a cross-sectional view illustrating that a first conductive pattern shown in FIG. 8 is disposed out of the alignment error range.

FIG. 7 is a plan view illustrating an apparatus for detecting pattern alignment error in accordance with a third embodiment of the present invention. FIG. 8 is a cross-sectional view taken along line III-III' in FIG. 7 showing a case where the first conductive layer is formed within the alignment error range. FIG. 9 shows a case where the first conductive layer is formed outside of the alignment error range.

Referring to FIGS. 7, 8, and 9, the pattern alignment error detecting apparatus 300 includes a first insulation member 310, a first conductive pattern 320 having an insulation pattern 325, a second to insulation member 330, a second conductive pattern 350 having a conductive via 345, and a third conductive pattern 370 having an additional conductive via 365.

The first conductive pattern 320 is disposed over the first insulation member 310. The first insulation member 310 includes insulation material.

The first conductive pattern 320 includes the insulation pattern 325. The insulation pattern 325 may be disposed, for example, at a center part of the first conductive pattern 320. In the present embodiment, the insulation pattern 325 may be a through hole that is formed in a portion of the first conductive pattern 320. The insulation pattern 325 has a circular shape with a diameter D when view from above. The diameter D of the insulation pattern 325 may be about 50 µm to 200 µm. The diameter D of the insulation pattern 125 may otherwise vary within the alignment error range. Alternatively, the insulation pattern may instead be an insulation layer or a photoresist pattern disposed over the first conductive pattern 320.

The second insulation member 330 is disposed over the first insulation member 310 and consequently covers the first conductive pattern 320. The second insulation member 330 includes insulation material.

A via hole 332 passes through the second insulation member 330. In the present embodiment, when the first conductive pattern 320 is formed within the alignment error range, the via hole 332 is formed at a portion corresponding to the insulation pattern 325 of the first conductive pattern 320. When the first conductive pattern 320 is formed outside of the alignment error range, the via hole 332 will be formed at a portion of the first conductive pattern 320 adjacent to the insulation pattern 325 (as shown in FIG. 9).

A conductive via 345 is placed inside the via hole 332 formed in the second insulation member 330. In the present embodiment, the conductive via 345 may have a cylindrical shape. The conductive via 345 having a cylindrical shape has a diameter D1 that is smaller than the diameter D of the insulation pattern 325. In the present embodiment, the area of the insulation pattern 325 may be about 105 to 200% of the area of the conductive via 345.

The second conductive pattern 350 is disposed over the second insulation member 330. In the present embodiment, the conductive via 345 and the second conductive pattern 350 may be formed integrally.

An examples of material that may be used as the conductive via 345 and the second conductive pattern 350 include aluminum, aluminum alloy, copper, cooper alloy, and metal alloy, etc.

The second insulation member 330 includes an additional via hole 363 that passes through the second insulation member 330. In the present embodiment, the additional via hole 363 is disposed at a portion of the first conductive pattern 320 adjacent to the insulation pattern 325. The additional conductive via 363 is placed inside the additional via hole 363, and the conductive via 363 contacts the first conductive pattern 320.

The third conductive pattern 370 is disposed over the second insulation member 330. In the present embodiment, the third conductive pattern 370 and the additional conductive via 365 may be formed integrally. The third conductive pattern 370 is electrically connected to a power line 380 that provides a DC voltage Vd to the third conductive pattern 370.

Hereinafter, the operation of the pattern alignment error detecting apparatus in accordance with the third embodiments of the present invention will be described with reference to the attached drawings.

FIG. 8 shows the case where the first conductive pattern 320 is disposed within the alignment error range. A plating solution may be applied to the second conductive pattern 350 and the third conductive pattern 375. The third conductive pattern 370 is electrically connected to the first conductive pattern 320 by the additional conductive via 365. However, the conductive via 345 is spaced apart from the first conductive pattern 120. Therefore, the DC voltage Vd applied to the third conductive pattern 370 by the power line 380, which in turn flows through the additional conductive via 365 and the first conductive pattern 320, does not reach the second conductive pattern 350 through the conductive via 345.

Therefore, when the first conductive pattern 320 is disposed within the alignment error range, the second conductive pattern 350 does not receive the DC voltage Vd, and consequently a plated layer is not formed over the second conductive pattern 350 even when the second conductive pattern 350 comes into contact with a plating solution. When the plating area is not formed, the fact that the first conductive pattern 120 is disposed within the alignment error range is confirmed.

Alternatively, it is possible to confirm that the first conductive pattern 320 is disposed within the alignment error range by measuring the voltage of the second conductive pattern 150, rather than applying a plating solution. When the plating solution is applied to the second and third conductive patterns 350 and 370, although a plated layer will not form over the second conductive pattern when the first conductive pattern is disposed within the alignment error range, a plated layer 375 will form over the third conductive pattern 370.

FIG. 9 is a cross-sectional view illustrating that the first conductive pattern shown in FIG. 8 is disposed out of the alignment error range.

FIG. 9 shows a case where the first conductive pattern 320 is disposed out of the alignment error range. In FIG. 9, the conductive via 345 is electrically connected to the first conductive pattern 320.

Therefore, the DC voltage Vd applied to the third conductive pattern 370 by the power line 380, which then travels through the additional conductive via 365 and the first conductive pattern, reaches the second conductive pattern 350 through the conductive via 345.

Therefore, when the plating solution is applied to the second conductive pattern, and the first conductive pattern 320 is out of the alignment error range, the second conductive pattern 350 received DC voltage Vd and a plated layer 355 is formed over the second conductive pattern 350. Alternatively, it is possible to confirm easily that the the first conductive pattern 320 is out of the alignment error range by measuring a voltage applied to the second conductive pattern 350 rather than applying the plating solution.

Figure 10:
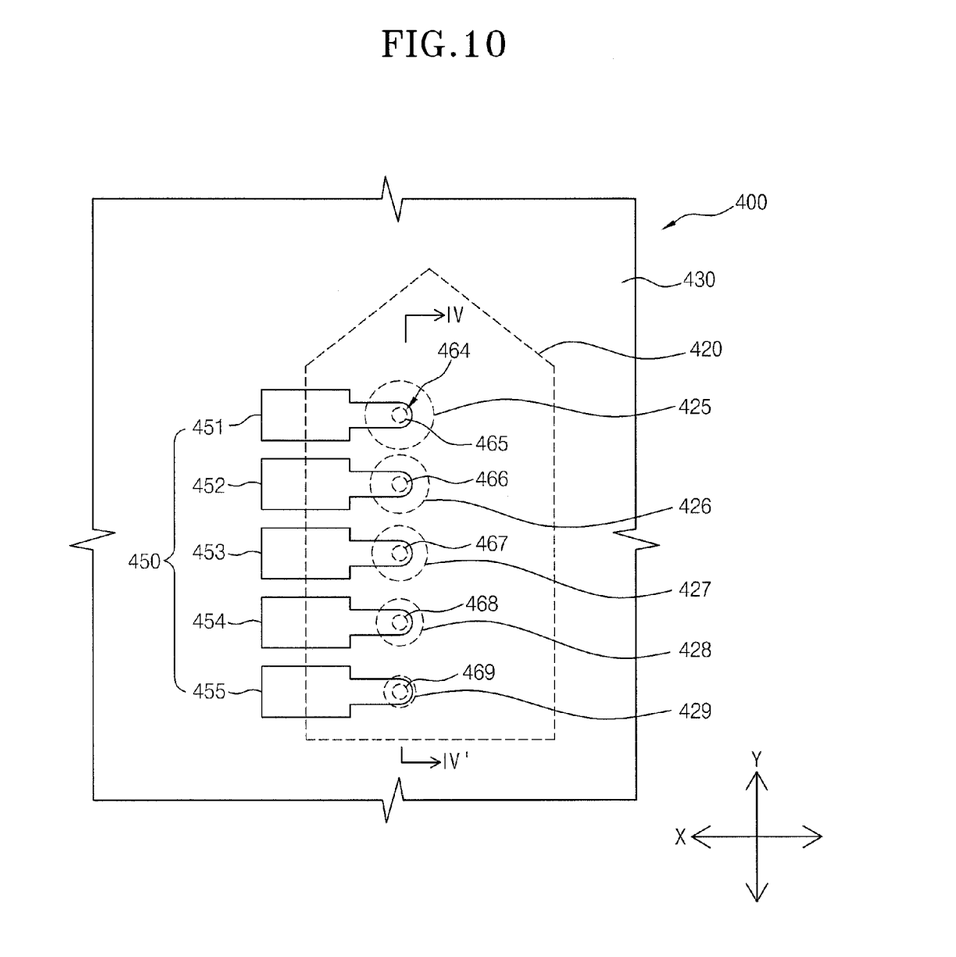
FIG. 10 is a plan view illustrating an apparatus for detecting pattern alignment error in accordance with a fourth embodiment of the present invention.
Figure 11:
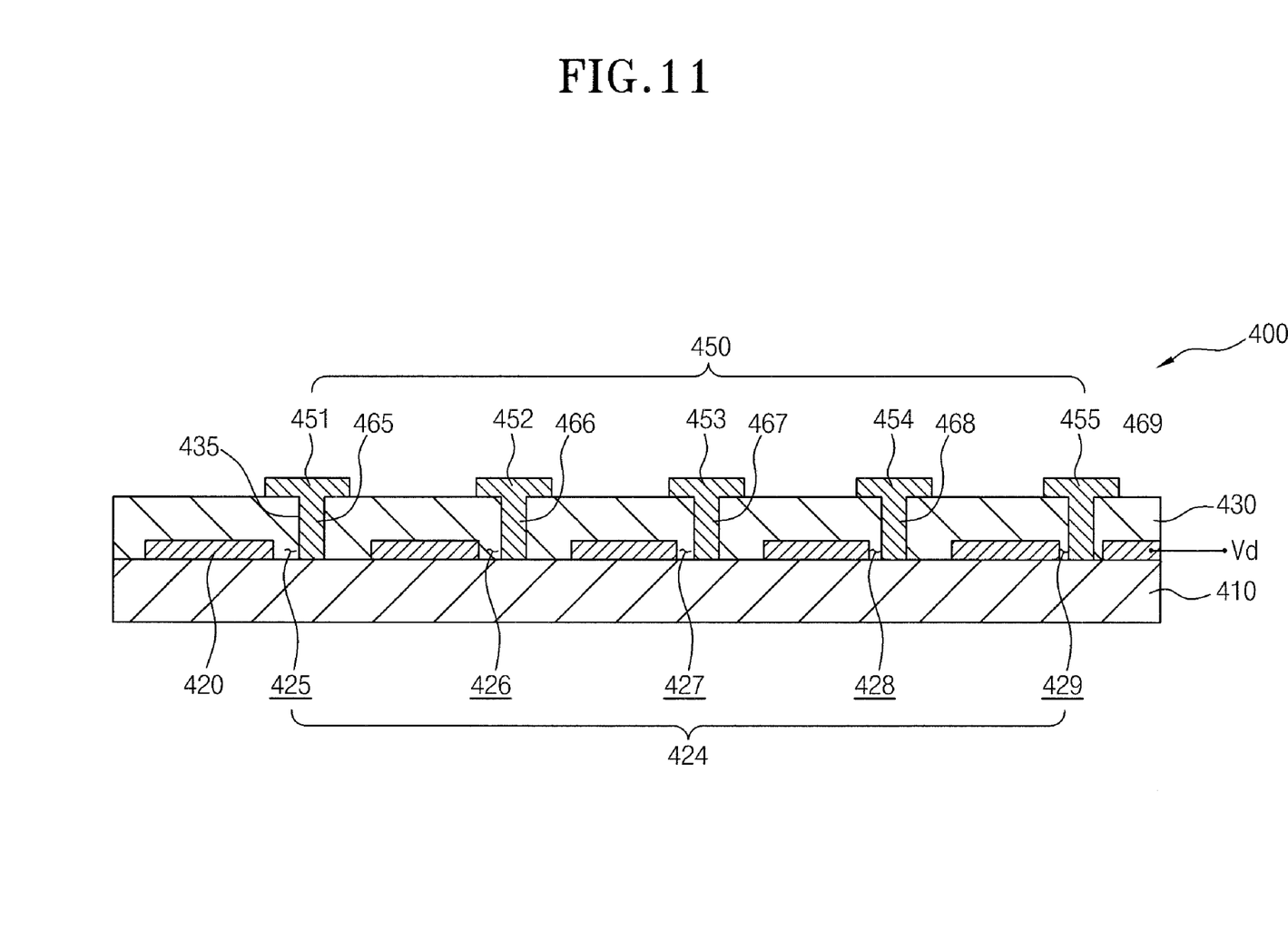
FIG. 11 is a cross-sectional view taken along line IV-IV' in FIG. 9.
Figure 12:
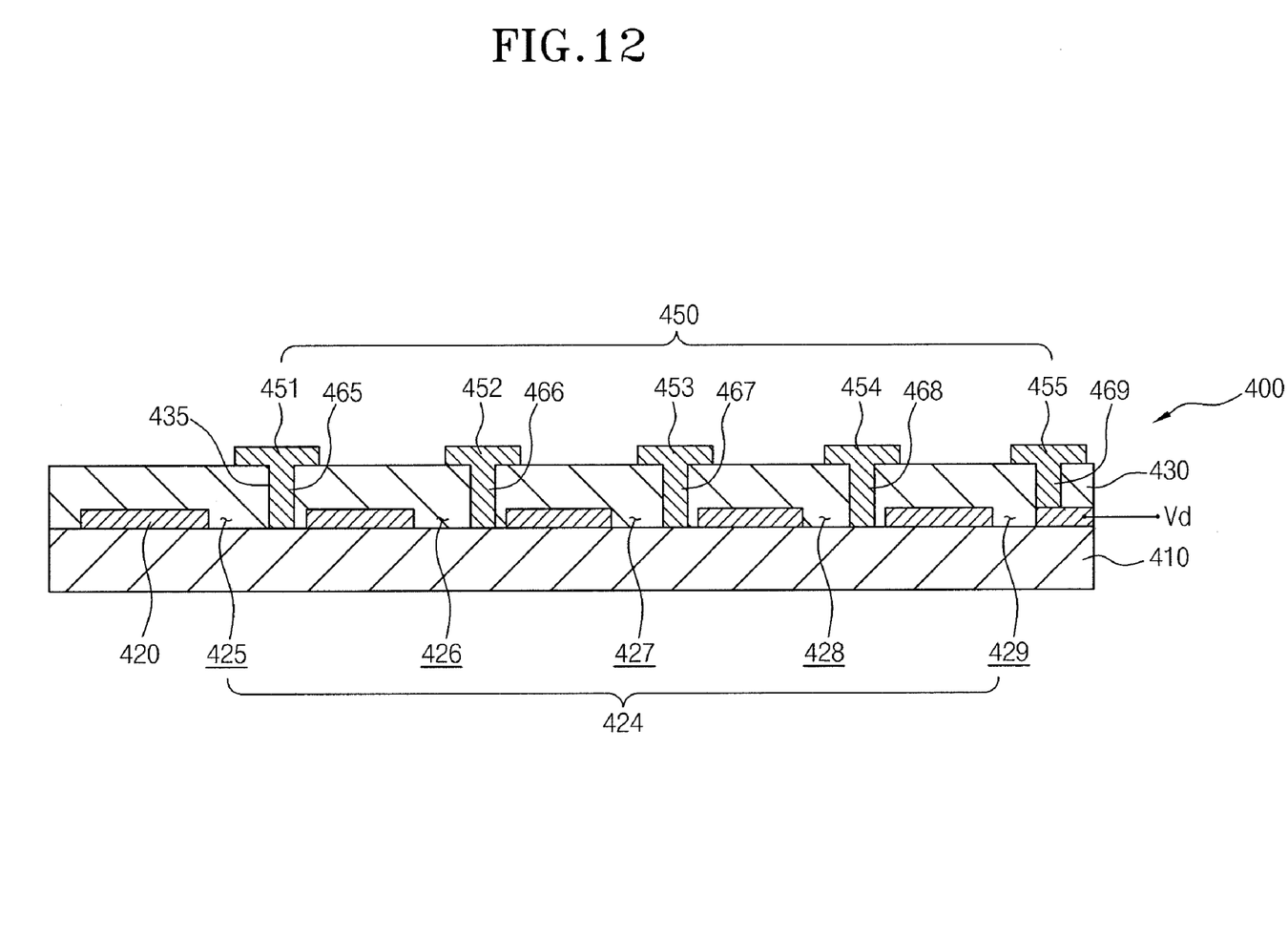
FIG. 12 is a cross-sectional view illustrating that a first conductive pattern shown in FIG. 11 is disposed out of the alignment error range.

FIG. 10 is a plan view illustrating an apparatus for detecting pattern alignment error in accordance with a fourth embodiment of the present invention. FIG. 11 is a cross-sectional view taken along line IV-IV' in FIG. 9 showing a case where the first conductive layer is formed within the alignment error range. FIG. 3 shows a case where the first conductive layer is formed outside of the alignment error range.

Referring to FIGS. 10, 11, and 12, the pattern alignment error detecting apparatus 400 includes a first insulation member 410, a first conductive pattern 420 having a plurality of insulation patterns 424, a second insulation member 430, and a second conductive pattern 450 having a plurality of conductive vias 464.

The first conductive pattern 420 is disposed over the first insulation member 410. The first insulation member 410 includes insulation material. The first conductive pattern 420 is electrically connected, for example, to a power line (not shown) through which a DC power source Vd is applied.

In the present embodiment, an example of materials that may be used as the first conductive pattern 420 and the power line include aluminum, aluminum alloy, copper, cooper alloy, metal alloy, etc.

The first conductive pattern 420 includes the insulation patterns 424. In the present embodiment, the insulation patterns 424 may be, for example, through holes that are formed in the first conductive pattern 420. The insulation pattern 125 has a circular shape when view from above. For example, the diameter of each insulation pattern 424 may be 50 μm to 200 μm. The diameter of the insulation pattern 424 may otherwise vary within the alignment error range.

The insulation patterns 424 are disposed along the Y-axis shown in FIG. 10. In the present embodiment, the number of the insulation patterns 424 is five. Hereinafter, the five insulation patterns are referred to as a first insulation pattern 425, a second insulation pattern 426, a third insulation pattern 427, a fourth insulation pattern 428, and a fifth insulation pattern 429.

In the present embodiment, the first to fifth insulation patterns 425 to 429 each have different sizes. For example, the first insulation pattern 425 has a first size, the second insulation pattern 426 has a second size, the third insulation pattern 427 has a third size, the fourth insulation pattern 428 has a fourth size, and the fifth insulation pattern 429 has a fifth size.

The second insulation member 430 is disposed over the first insulation member 410 and consequently covers the first conductive pattern 420. The second insulation member 430 includes insulation material.

The second insulation member 430 includes a plurality of via holes 435 that each pass through the second insulation member 430. In the present embodiment, when the first conductive pattern 420 is formed within the alignment error range, the via holes 435 are formed at portions of the second insulation member corresponding to the respective insulation patterns 425 to 429. When the first conductive pattern 420 is formed outside of the alignment error range, the via holes 435 may be formed at portions of the first conductive pattern 420 adjacent to the insulation patterns 425 to 429.

The conductive vias 465, 466, 467, 468 and 469 are placed respectively inside the via holes 435 formed in the second insulation member 430. In the present embodiment, the conductive vias 465 to 469 may have, for example, a cylindrical shape.

The conductive vias 465 to 469 having the cylindrical shape have the same diameters. The diameter of the conductive vias 465 to 469 is smaller than the diameter of the insulation patterns 425 to 429. In the present embodiment, areas of the insulation patterns 425 to 429 may be 105 to 200% of the areas of the conductive vias 465 to 469 respectively.

The second conductive patterns 451, 452, 453, 454, 455 are disposed over the second insulation member 430. In the present embodiment, the conductive patterns 450 are formed integrally with the corresponding conductive via 465 to 469.

Hereinafter, the operation of the pattern alignment error detecting apparatus in accordance with the fourth embodiments of the present invention will be described with reference to the attached drawings.

FIG. 11 shows the case where the first conductive pattern 420 is disposed within an alignment error range. A plating solution may be applied to the second conductive patterns 450. The conductive vias 145 and the first conductive pattern 420 are spaced apart from each other (i.e. they don't connect) and thus the DC voltage Vd applied to the first conductive pattern 420 does not reach the second conductive patterns 450 through the conductive vias 465 to 469.

Therefore, when the first conductive pattern 420 is disposed within the alignment error range, the second conductive pattern 450 does not receive DC voltage Vd and consequently a plated layer is not formed over each second conductive pattern 450 even when the second conductive pattern 450 comes into contact with a plating solution. When the plating area is not formed, the fact that the first conductive pattern 420 is disposed within the alignment error range is confirmed. Alternatively, it is possible to confirm that the first conductive pattern 420 is disposed within the alignment error range by measuring the voltage of each second conductive pattern 450, rather than applying the plating solution.

FIG. 12 is a cross-sectional view illustrating that a first conductive pattern shown in FIG. 11 is disposed out of an alignment error range.

FIG. 12 shows a case where the first conductive pattern 420 is disposed out of the alignment error range. When the first conductive pattern 420 is disposed out of the alignment error range, some of the conductive vias 465 to 469 may be electrically connected to the first conductive pattern 420. For example, the conductive via 469 corresponding to the fifth insulation pattern 429 has a relatively small area, and thus is electrically connected to the first conductive pattern 420.

Therefore, when the plating solution is applied to the second conductive patterns 450, and the DC voltage Vd applied to the first conductive pattern 420 reaches the second conductive pattern 455 through the conductive via 469, a plated layer 480 is formed over the second conductive pattern 455. Alternatively, it is possible to confirm easily that the disposition of the first conductive pattern 420 is out of the alignment error range by measuring a voltage applied to the second conductive patterns 451 to 455 rather than applying the plating solution.

In a case where the alignment error range of the first conductive pattern 420 is small, the number of the second conductive patterns 451 to 455 on which the plated layer is formed is small. In contrast, in a case that the alignment error range of the first conductive pattern 420 is large, the number of the second conductive patterns 451 to 455 on which the plated layer is formed increases.

The pattern alignment error detecting apparatus described above can be applied to various devices having multi-layered wiring. For example, the pattern alignment error detecting apparatus may be applied to a printed circuit board having multi-layered wiring, a semiconductor chip having multi-layered wiring, a semiconductor package having multi-layered wiring, etc.

As is apparent from the above description, there is a major advantage in using the present invention, in that the alignment error of the lower wiring of a multi-layered wiring can be easily recognized.

Although specific embodiments of the present invention have been described for illustrative purposes, those skilled in the art will appreciate that various modifications, additions and substitutions are possible, without departing from the scope and the spirit of the invention as disclosed in the accompanying claims.

The invention claimed is:

1. A method for a detecting whether or not a pattern alignment error exists in a printed circuit board having an apparatus comprising: a first conductive pattern disposed over a first insulation member; a second insulation member covering the first conductive pattern; a second conductive pattern disposed on the second insulation layer; a conductive via electrically connected to the second conductive pattern and passing through the second insulation member; and an insulation pattern disposed in the first conductive pattern, the method comprising:

applying a power source to the first conductive pattern;
contacting a plating solution over the second conductive pattern; and
inspecting the second conductive pattern for a plated layer grown on top of second conductive pattern to detect whether or not the pattern alignment error exists.

2. The method of claim 1, wherein when the plated layer is found on top of the second conductive pattern then the pattern alignment error is determined to exist.

3. The method of claim 1, wherein when the plated layer is not found on top of the second conductive pattern then the pattern alignment error does is determined not to exist.

* * * * *